United States Patent [19]

Sawada et al.

[11] Patent Number: 4,827,453
[45] Date of Patent: May 2, 1989

[54] SEMICONDUCTOR MEMORY CONTROL CIRCUIT

[75] Inventors: Kazuhiro Sawada, Yokohama; Takayasu Sakurai, Tokyo, both of Japan

[73] Assignee: Kabushiki Kaisha Toshiba, Kawasaki, Japan

[21] Appl. No.: 127,261

[22] Filed: Dec. 1, 1987

[30] Foreign Application Priority Data

Dec. 26, 1986 [JP] Japan .................................. 61-315361

[51] Int. Cl.$^4$ .............................................. G11C 7/00
[52] U.S. Cl. .................................................. 365/222
[58] Field of Search ............... 365/189, 222, 230, 233, 365/149

[56] References Cited
U.S. PATENT DOCUMENTS 4,334,295  6/1982  Nagami ................................ 365/222

OTHER PUBLICATIONS

Minato et al., "A 20ns 64K CMOS SRAM," IEEE International Solid-State Circuits Conference, ISSCC Digest, pp. 222-223, Feb. 23, 1984.

Primary Examiner—Joseph A. Popek
Attorney, Agent, or Firm—Finnegan, Henderson, Farabow, Garrett, & Dunner

[57] ABSTRACT

A semiconductor memory control circuit separates an externally input operation activation signal from an operation activation signal which is transferred inside a memory, and activates the internal operation activation signal only for a predetermined period of time. This predetermined period is determined in accordance with the cycle time required to achieve refreshment of a memory cell after the external operation activation signal is activated. Thereafter, even if the external operation activation signal is in an activated state, the internal operation activation signal is inactivated. When the internal operation activation signal is in the activated state and the external operation activation signal is inactivated, the internal operation activation signal is inactivated, in accordance with activation of the external operation activation signal.

7 Claims, 5 Drawing Sheets

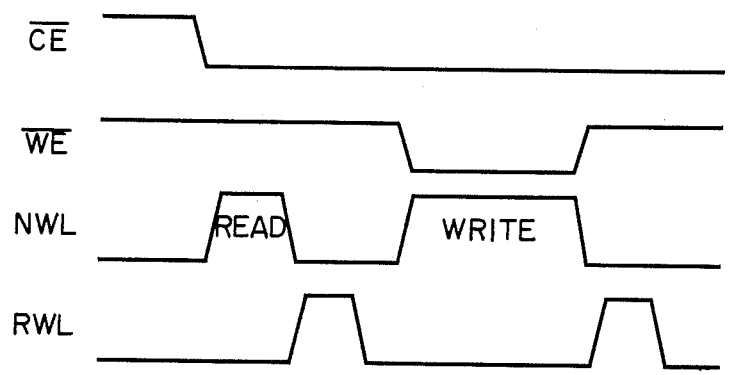
F I G. 3

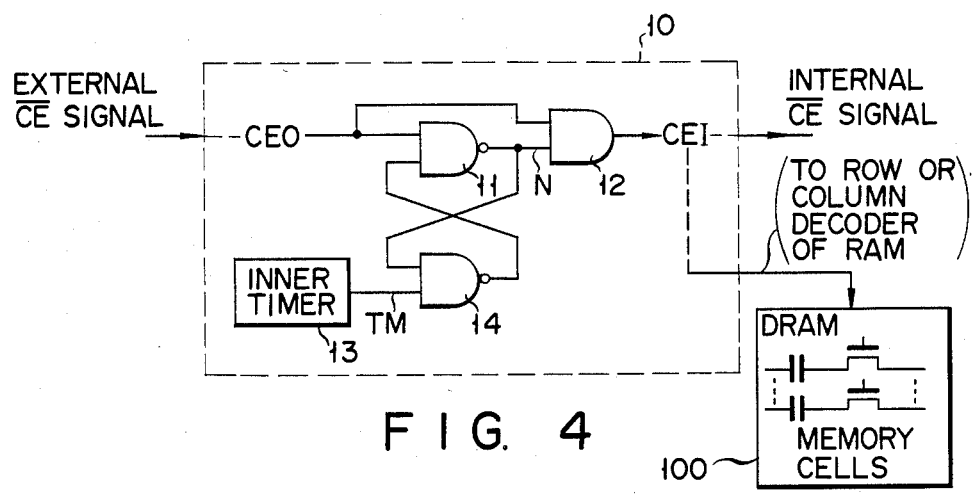
F I G. 4
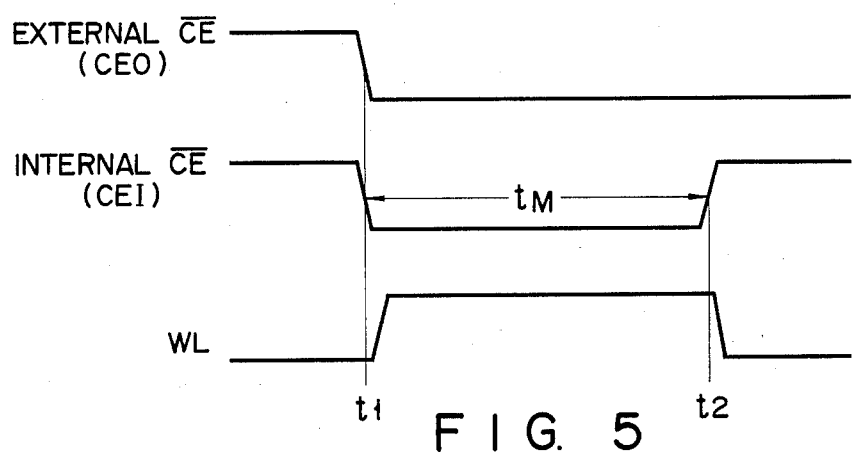
F I G. 5
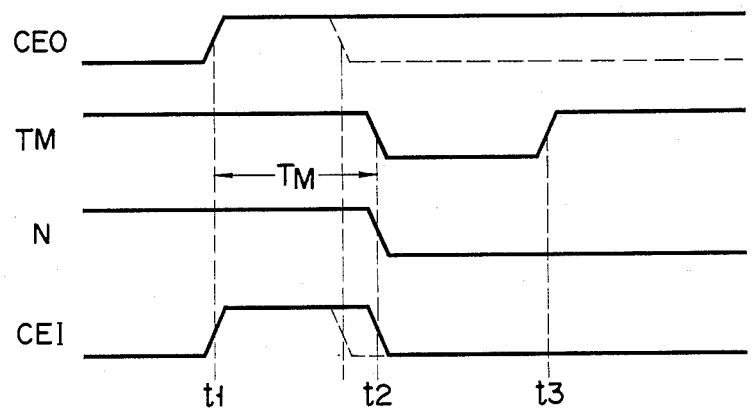
F I G. 6

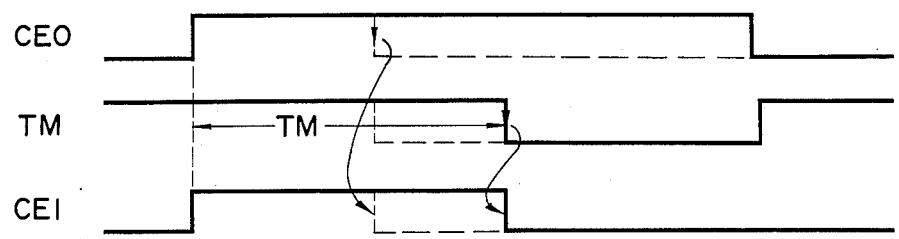
F I G. 10
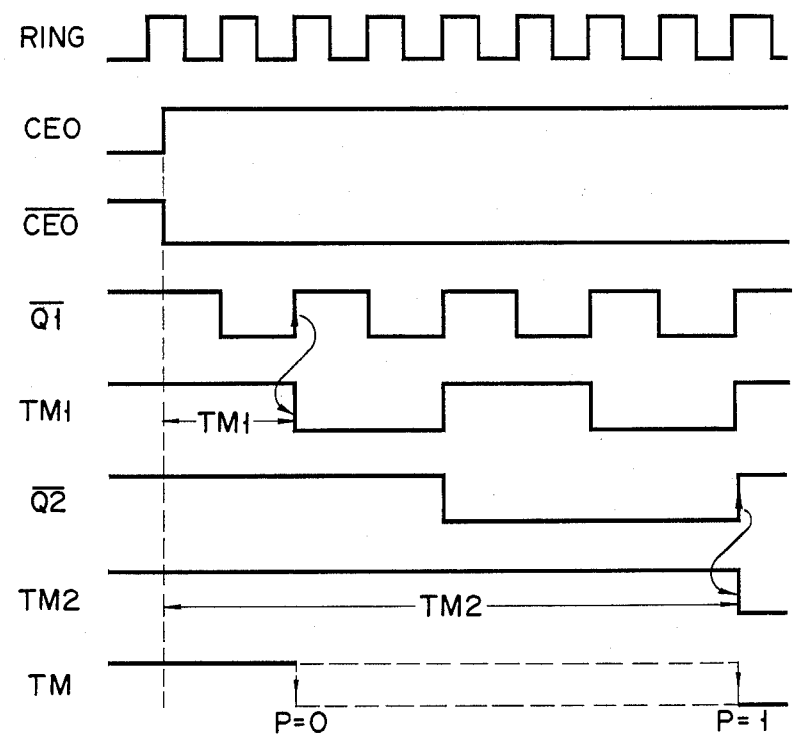
F I G. 12

SEMICONDUCTOR MEMORY CONTROL CIRCUIT

BACKGROUND OF THE INVENTION

The present invention relates to a semiconductor memory device and, more particularly, to a semiconductor memory control circuit for controling the activation period of an internal transfer operation of a refreshtype semiconductor memory using a memory cell in which stored data must be refreshed.

A dynamic random-access memory (to be hereinafter referred to as a DRAM) and a pseudo static RAM (to be hereinafter referred to as a PSRAM) are known as conventional refresh-type semiconductor memories. These memories include memory cells each comprising one MOS transistor and one capacitor. The word line of such a conventional refresh memory is driven as shown in FIG. 1. While chip enable signal $\overline{CE}$ is at low level "L" (active low), word line WL is kept open (active high). In this case, if signal $\overline{CE}$ is set at low level for a long period of time, the active pull-up level of the word line is reduced, by a leakage current, to below active level $V_H$, and an "H" level having a sufficient potential cannot be written in the memory cell. Therefore, conventionally, a maximum value is assigned to time tCE, during which signal $\overline{CE}$ is at low level, thereby to limit the time period.

However, the refresh-type memory adapting the above word drive method is faced with the problem as to how it is to be connected to a CPU (Central Processing Unit) or an MPU (Microprocessing Unit) when it s used in a computer system. This situation will be described with reference to a timing chart of FIG. 2, in which a read operation of the CPU is illustrated.

In FIG. 2, reference symbol CLK denotes a system clock; AD, an address bus signal and data bus signal in the CPU; ALE, an address latch signal; and $\overline{RD}$, a read signal. If an effective address signal is present in the address bus during a period of clock cycle T1, the CPU generates the ALE pulse.

On the other hand, in a refresh-type memory in which the maximum limit value (tCE max) exists in time tCE of signal $\overline{CE}$ as described before, a pulse of negative polarity, which completes in one read cycle, must be input to a $\overline{CE}$ terminal. Otherwise, a problem of level down in word line WL is posed.

Therefore, conventionally, signal ALE of FIG. 2 is not connected directly to the $\overline{CE}$ terminal at an interface between the CPU and the refresh-type memory. Rather, signal $\overline{RD}$, which goes to low level during a period of clock cycle T2 and then goes to high level during a period of clock cycle T4, is supplied as signal $\overline{CE}$ to the $\overline{CE}$ terminal.

During a period of clock cycle T3, the CPU receives data of signal AD supplied, via the data bus, from the refresh-type memory. At this time, confirmation of the valid data is sometimes not yet completed. Therefore, an extra period of time, i.e., a wait cycle, must be undesirably included in the CPU overall operation time.

In order to eliminate the above problem, level down of the word line of the refresh-type memory, caused by the leakage current, may be prevented by, for example, a pump circuit. However, according to this method, (1) current consumption is increased by the addition of the pump circuit, and (2) self refreshing cannot be performed if the word line is kept open during a low-level period of signal $\overline{CE}$.

To avoid the above problems, the applicant of the present invention has proposed a "Control Circuit for Semiconductor Memory Device" in Japanese Patent Application No. 61-30139. This application corresponds to U.S. patent application Ser. No. 012,315 filed on Feb. 9, 1987, (All disclosures of this U.S. application are incorporated in the present application.)

As is shown in the timing chart of FIG. 3, the control circuit of the above U.S. application is characterized by word line NWL being intermittently driven in the read mode and being continuously activated in the write mode in accordance with a write timing. When the word line is closed, the control circuit immediately precharges a bit line, etc., to start a refresh operation, and opens refresh word line RWL. However, according to this method, the word line must be driven differently in the read and write modes. As a result, the arrangement of the control circuit for driving the word line becomes undesirably complicated.

SUMMARY OF THE INVENTION

It is accordingly an object of the present invention to provide a semiconductor memory control circuit by which a CPU or MPU can be free of an insertion of a wait cycle or loss time caused when signal $\overline{RD}$ is supplied to a $\overline{CE}$ terminal during a read operation of the CPU or MPU, and which enables the connecting interface, with respect to the CPU or MPU, to be simplified.

According to the semiconductor memory control circuit of the present invention, an operation activation signal which is externally input is separated from that transferred inside the memory. After the external operation activation signal is activated, the internal operation activation signal is activated only for a predetermined period of time, determined in accordance with the cycle time (refresh cycle) required to achieve refreshment of the memory cell. Thereafter, even if the external operation activation signal is in an activated state, the internal operation activation signal is inactivated. When the external operation activation signal changes to an inactivated state while the internal operation activation signal is in the activated state, the internal operation activation signal is inactivated.

As a result, without using an external operation activation signal which completes in one read cycle of the memory, a memory operation can be activated by the internal operation activation signal generated for a constant period, and the time during which the word line is open can be limited to a predetermined period. In addition, since the predetermined period of time is determined by the cycle time required to achieve refreshment of the memory cell, the refresh operation is not prevented. Therefore, a signal which is not completed in one read cycle of the memory, such as signal ALE output from the CPU, can be supplied directly to an external operation activation signal terminal of the memory, at an interface between the refresh-type memory and the CPU, thereby simplifying the interface by the above direct signal supply.

BRIEF DESCRIPTION OF THE DRAWINGS

FIG. 3 is a timing chart showing a refresh timing in a proposed semiconductor memory device which performs a refresh operation of stored data within a reading/writing cycle;

FIG. 4 is a logic circuit diagram showing an embodiment of a semiconductor memory control circuit according to the present invention;

FIG. 5 is a timing chart showing waveforms of an operation activation signal and a word line selective drive signal in a sync RAM having a control circuit shown in FIG. 4;

FIG. 6 is a timing chart showing waveforms of respective signals in the control circuit shown in FIG. 4;

FIG. 10 is a timing chart showing material waveforms of FIG. 9;

FIG. 12 is a timing chart showing material waveforms of FIG. 11.

DETAILED DESCRIPTION OF THE PREFERRED EMBODIMENT

Figure 1:
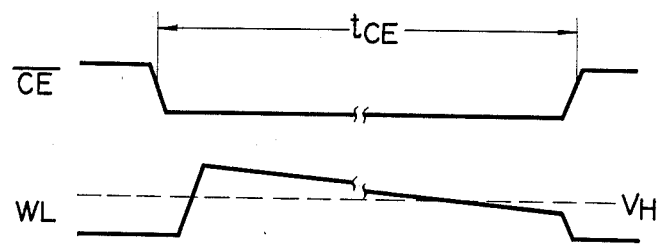
FIG. 1 is a timing chart showing waveforms of an operation activation signal and a word line drive signal appearing in a conventional refresh-type memory.
Figure 2:
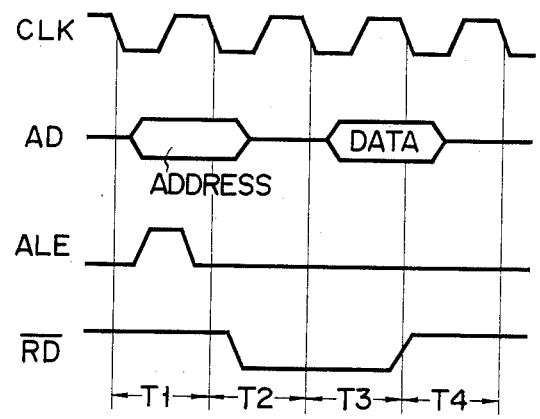
FIG. 2 is a timing chart showing a timing of a read operation of a CPU or MPU in a computer system.

An embodiment of the present invention will be described in detail with reference to the accompanying drawings.

In a refresh-type memory, e.g., in a sync RAM, an external terminal ($\overline{CE}$ terminal) for a chip enable inversion signal ($\overline{CE}$) receives signal $\overline{CE}$ as an operation activation signal. A $\overline{CE}$ signal input is input to control circuit 10 as shown in FIG. 4. An internal $\overline{CE}$ signal (operation activation signal to be transferred inside the memory) generated from circuit 10 is transferred to a row or column decoder of DRAM 100.

Note that in FIG. 4, a phase of the external $\overline{CE}$ signal is opposite to that of signal CEO, and a phase of the internal $\overline{CE}$ signal is opposite to that of signal CEI.

The control circuit shown in FIG. 4 will be described below.

Circuit 10 detects that the external $\overline{CE}$ signal input is activated (enabled) (H→L) and activates the internal CE signal (H→L). If the external $\overline{CE}$ signal input is kept activated (L) for more than predetermined period of time tM which is substantially the same as a cycle time required to achieve refreshment of the memory cell, the internal $\overline{CE}$ signal is inactivated (disabled) after time tM has elapsed. If the external $\overline{CE}$ signal input is inactivated (L) within time tM, the internal $\overline{CE}$ signal is also inactivated.

In the refresh-type memory using the above control circuit, when the external $\overline{CE}$ signal input goes to low level (activated state) so as to activate a memory chip at time t1 as shown in FIG. 5, the internal $\overline{CE}$ signal goes to low level (activated state) in accordance therewith and enables the chip, and memory cell selection word line WL is opened (high level). Thereafter, even if the external $\overline{CE}$ signal input is kept activated, the internal $\overline{CE}$ signal goes to high level (inactivated state) at time t2 after time tM, and the chip is disenabled. As a result, line WL is closed (goes to low level) at time t2, so that a self refreshing operation of the memory can be done.

Therefore, when the above refresh-type memory is to be connected to a CPU (or MPU) in a computer system, even a signal which does not complete in one read cycle such as address latch signal ALE from the CPU can be supplied directly to a $\overline{CE}$ terminal as signal $\overline{CE}$, thereby simplifying an interface with respect to the CPU.

Note that as for internal timer time tM in circuit 10, a time of about 10 μs may be selected in consideration of a self refreshing interval of the memory. This time of about 10 μs is a sufficiently short time which does not adversely affect a read/write operation of the CPU.

An arrangement of circuit 10 shown in FIG. 4 will be described below, and an operation thereof will be described with reference to a timing chart in FIG. 6.

In FIG. 4, an illustration of buffer stages is omitted, and positive and negative logics of activation signals CEO and CEI are opposite to those of signal $\overline{CE}$ shown in FIG. 5. External activation signal input CEO is supplied to the first input terminal of two-input NAND gate 11 and to the first input terminal of two-input AND gate 12. Timer signal TM supplied from internal timer 13 is supplied to the first input terminal of two-input NAND gate 14. The second input terminals of NAND gates 11, 14 and the output terminals of NAND gates 14, 11 are cross-coupled with each other, i.e., flip-flop-connected. An output (N) from NAND gate 11 is supplied to the second input terminal of AND gate 12.

Assume that signal CEO of positive logic is activated (H) at time t1 as shown in FIG. 6. In this case, after elapsing a predetermined period of time, output node N of NAND gate 11 is kept at high level until signal TM changes from high to low level at time t2. Output signal (internal operation activation signal) CEI from AND gate 12 is activated (H) at time t1, and is inactivated (L) at time t2 even if signal CEO is in an activated state (H). Thereafter, even when signal TM returns to high level at time t3, signal CEI is kept in an inactivated state (L). When a period of the activated state of signal CEO ends before time t2 at which signal TM is generated, signal CEO becomes signal CEI through AND gate 12 as indicated by a broken line of FIG. 6.

Figure 7:
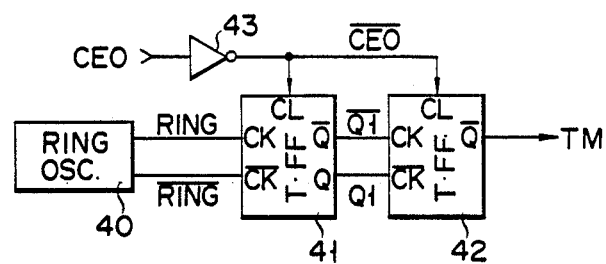
FIG. 7 is a logic circuit diagram showing an internal timer shown in FIG. 4.
Figure 8:
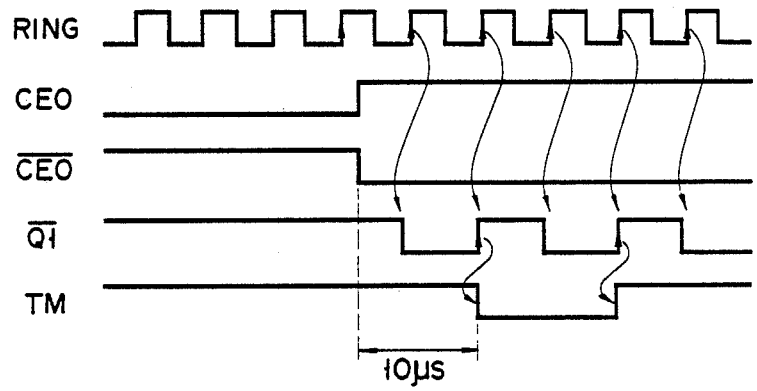
FIG. 8 is a timing chart showing waveforms of respective signals in the internal timer shown in FIG. 7.

An arrangement and an operation of timer 13 of FIG. 4 will be described with reference to FIGS. 7 and 8. In FIG. 7, output signals RING and $\overline{RING}$ having phases opposite to each other from ring oscillator 40 are respectively input to positive and negative clock input terminals CK and $\overline{CK}$ of first toggle (T)-type flip-flop circuit (to be simply referred to as an FF circuit hereinafter) 41. Output terminals $\overline{Q}$ and Q of FF circuit 41 are connected to input terminals CK and $\overline{CK}$ of second T-type FF circuit 42, respectively. An output signal from output terminal $\overline{Q}$ of FF circuit 42 becomes internal timer signal TM. Signal $\overline{CEO}$ obtained by inverting signal CEO by inverter 43 is supplied to clear input terminal CL of each of FF circuits 41 and 42.

When the CEO signal is activated (H), signal $\overline{CEO}$ goes to low level, and FF circuits 41 and 42 are released from a reset state. Output signal $\overline{Q1}$ from FF circuit 41 is inverted every time signal RING rises, and output signal TM from FF circuit 42 is inverted every time signal $\overline{Q1}$ rises. In this case, a ring oscillation output frequency is determined such that signal TM is generated after about 10 μs from activation (L→H) of signal CEO. When signal CEO is inactivated (L), FF circuits 41 and 42 are reset by signal $\overline{CEO}$, and signal TM goes to predetermined level (H).

Figure 9:
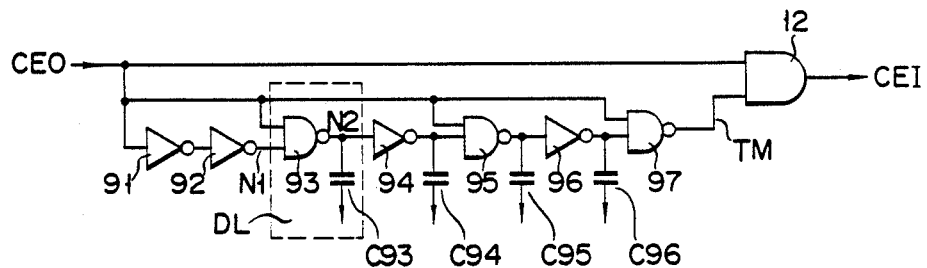
FIG. 9 is a circuit diagram showing a modification of FIG. 4.

FIG. 9 shows a modification of the memory control circuit of FIG. 4. In the embodiment of FIG. 4, internal timer signal TM is obtained from special oscillator 13. However, in the modification of FIG. 9, signal TM is obtained by signal processing of external activation signal CEO, without using an oscillator.

That is, signal CEO is supplied to the first input terminal of AND gate 12 and inverter 91. Signal CEO supplied to inverter 91 becomes signal N1 through inverter 92 and is supplied to the first input terminal of NAND gate 93. The second input terminal of NAND gate 93 receives signal CEO. The output terminal of NAND gate 93 is connected to a circuit ground (or a power source circuit) through capacitor C93. NAND gate 93 and capacitor C93 constitute NAND gate delay element DL. Delayed output N2 is obtained from the output terminal of NAND gate 93.

Output N2 is further delayed by inverter 94 and capacitor C94 and supplied to the first input terminal of a second NAND gate delay element constituted by NAND gate 95 and capacitor C95. The second input terminal of NAND gate 95 receives signal CEO. An output from NAND gate 95 is supplied to the first input terminal of NAND gate 97 through an inverter delay element constituted by inverter 96 and capacitor 96C. The second input terminal of NAND gate 97 receives signal CEO. Signal TM is obtained from the output terminal of NAND gate 97 and supplied to the second input terminal of AND gate 12.

FIG. 10 is a timing chart showing a circuit operation of FIG. 9. A total delay time of the delay circuit constituted by elements 93 to 96 and C93 to C96 corresponds to the time (e.g., 10 μs) determined by signal TM.

When an H level duration of signal CEO is longer than a time determined by signal TM, the delay circuit formed of elements 93 to 96 operates similarly to a normal inverter delay circuit (as indicated by a solid line in FIG. 10). On the other hand, when the duration of signal CEO is shorter than the time determined by signal TM, NAND gates 93, 95, and 97, and AND gate 12 are closed at the same time. Then, signal CEO goes to low level, so that internal activation signal CEI as indicated by a broken line in FIG. 10 is obtained.

Figure 11:
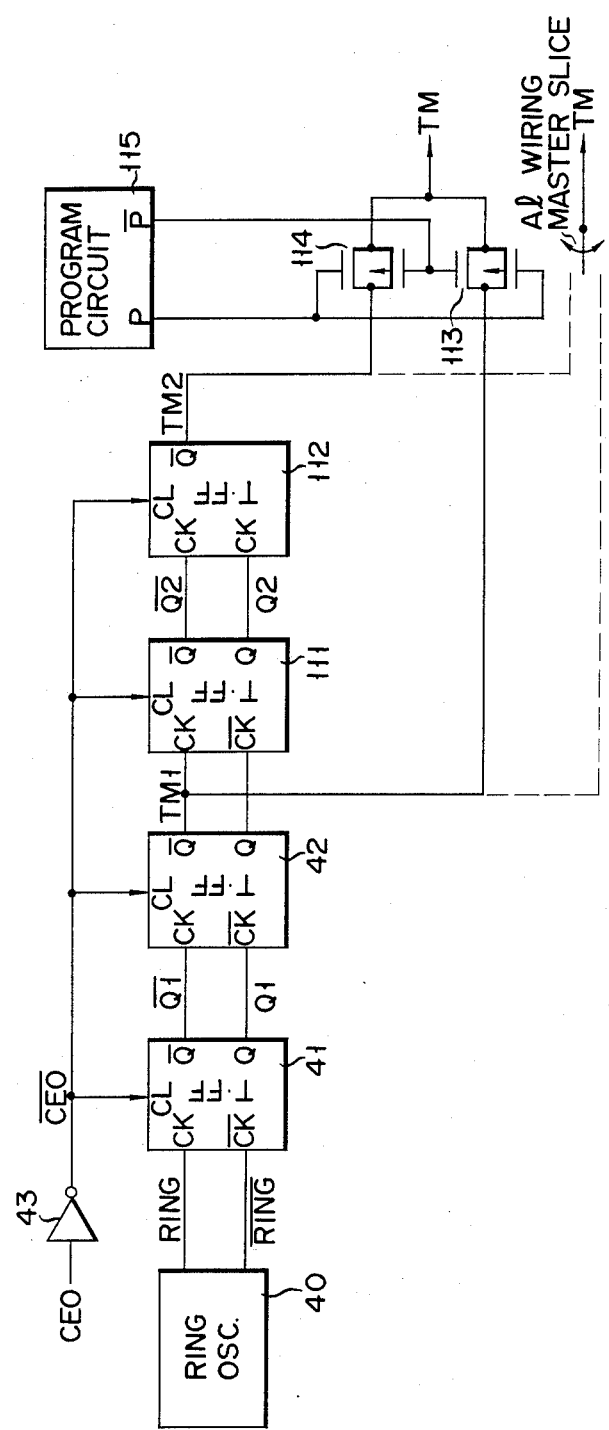
FIG. 11 is a circuit diagram showing a modification of FIG. 7.

FIG. 11 shows a modification of the memory control circuit of FIG. 7. FIG. 12 is a timing chart showing signal waveforms of respective sections of FIG. 11. In the embodiment of FIG. 7, only one type of internal timer signal TM is obtained. However, in the modification of FIG. 11, two types of signal TM can be selectively obtained.

That is, output signal CEO from inverter 43 of FIG. 11 is supplied to clear input terminals of T-type FFs 41, 42, 111, and 112. Circuit arrangements of ring oscillator 40 and FFs 41 and 42 are the same as those shown in FIG. 7. Q and $\overline{Q}$ outputs from FF 42 are supplied to CK and $\overline{CK}$ input terminals of FF 111, and Q and $\overline{Q}$ outputs from FF 111 are supplied to CK and $\overline{CK}$ input terminals of FF 112. First timer signal TM1 is obtained from the $\overline{Q}$ output terminal of FF 42, and second timer signal TM2 is obtained from the $\overline{Q}$ output terminal of FF 112.

Signal TM1 is input to transfer gate 113, and signal TM2 is input to transfer gate 114. Only one of transfer gates 113 and 114 is conducted by complementary outputs P and $\overline{P}$ from program circuit 115 (i.e., when P=0, signal TM1 is output as timer signal TM to an external circuit, and when P=1, signal TM2 is output as timer signal TM thereto).

In the arrangement of FIG. 11, since a pulse width of signal TM2 is longer than that of signal TM1, two types of timer signals TM can be obtained by the transfer gates or by an aluminum master slice.

Note that instead of using transfer gates 113 and 114 and program circuit 115, an aluminum wiring from the $\overline{Q}$ output terminal of FF 42 or that from the $\overline{Q}$ output terminal of FF 112 may be selected by an aluminum master slice, when an IC containing the circuit of this invention is manufactured and signal TM1 or TM2 is to be output as timer signal TM.

The present invention is not limited to a DRAM as in the above embodiment. For example, the present invention can be applied to a pseudo static RAM or a memory (e.g., a memory disclosed in U.S. application Ser. No. 012,315) which time-parallel performs a refresh operation of stored data in a read/write cycle period at a timing as shown in FIG. 3.

According to the semiconductor memory control circuit of the present invention, since the external activation signal is separated from the internal activation signal, the memory can be activated only for a predetermined period of time which corresponds to a cycle time required to achieve refreshment of the memory. Further, the memory can be inactivated regard less of a state of the external activation signal. Therefore, a signal, which does not complete in one read cycle, can be used as the external activation signal, to thereby simplify an interface with respect to a CPU when the memory is use in a computer system.

What is claimed is:

1. A semiconductor memory control circuit comprising:

timer means for determining the elapse of a predetermined time period;

first means, coupled to said timer means for activating an internal operation activation signal when an external operation activation signal is in an activated state, and, when said external operation activation signal is kept in said activated state for more than said predetermined time period, for inactivating said internal operation activation signal after elapse of the predetermined time; and second means, coupled to said first means and said timer means, for, when said external operation activation signal is inactivated within the predetermined time period, inactivating said internal operation activation signal, in response to the above inactivation.

2. A circuit according to claim 1, wherein the semiconductor memory includes a memory cell for storing data to be refreshed, and wherein the timer means determines the elapse of the predetermined time in proportion to a memory operation cycle time required to achieve refreshment of said memory cell.

3. A circuit according to claim 1, wherein said timer means includes:

a timer circuit for generating a gate signal which is kept at a first logic level before the predetermined time elapses and after said external operation activation signal is activated, and which goes to a second logic level after the predetermined time has elapsed; and a gate circuit, coupled to said timer circuit, for generating said internal operation activation signal only while said external operation activation signal is in the activated state and said gate signal is kept at the first logic level.

4. A circuit according to claim 3, wherein said timer circuit includes:

a delay circuit for outputting a timer signal obtained by delaying a level change point of said external operation activation signal by a predetermined time while said external operation activation signal is kept at the first logic level, and when said external operation activation signal changes from the first logic level to the second logic level, for outputting said timer signal which changes unconditionally in synchronism with the above change of said external operation activation signal.

5. A circuit according to claim 3, wherein said timer circuit includes:
   a timer for generating a timer signal which is kept at a first logic level before the predetermined time elapses and after said external operation activation signal is activated, which goes to a second logic level after the predetermined time has elapsed, and which returns to the first logic level when the predetermined time has elapsed after said external operation activation signal goes to the second logic level;
   a flip-flop, coupled to said timer, and responsive to said external operation activation signal and said timer signal, for outputting a gate signal when said timer signal changes from the first logic level to the second logic level; and
   a gate circuit, coupled to said flip-flop, for generating said internal operation activation signal only while said external input operation activation signal is in the activated state and said gate signal is kept at the first logic level.

6. A circuit according to claim 5, wherein said timer includes:
   a first timer for generating a first timer signal which is kept at the first logic level before a first predetermined time elapses and after said external operation activation signal is activated, and which goes to the second logic level after the first predetermined time has elapsed;
   a second timer, coupled to said first timer, for generating a second timer signal which is kept at the first logic level before a second predetermined time elapses and after said external operation activation signal is activated, and which goes to the second logic level after the second predetermined time has elapsed; and
   timer signal selecting means, coupled to said first and second timers, for outputting one of said first timer signal and second timer signal as said timer signal.

7. A circuit according to claim 5, wherein said timer includes:
   a first timer for generating a first timer signal which is kept at the first logic level before a first predetermined time elapses and after said external operation activation signal is activated, which goes to the second logic level after the first predetermined time has elapsed, and which returns to the first logic level when a predetermined time has elapsed after said first timer signal goes to the second logic level;
   a second timer, coupled to said first timer, for generating a second timer signal which is kept at the first logic level before a second predetermined time elapses and after said external operation activation signal is activated, which goes to the second logic level after the second predetermined time has elapsed, and which returns to the first logic level when a predetermined time has elapsed after said second timer signal goes to the second logic level; and
   timer signal selecting means, coupled to said first and second timers, for outputting one of said first timer signal and second timer signal as said timer signal.

* * * * *